(12) United States Patent
Nishikawa

(10) Patent No.: US 6,411,079 B1
(45) Date of Patent: Jun. 25, 2002

(54) PRINTED CIRCUIT BOARD TESTING APPARATUS WITH DEDICATED TEST HEAD AND VERSATILE-USE TEST HEAD

(75) Inventor: Hideo Nishikawa, Kyoto (JP)

(73) Assignee: Nidec-Read Corporation, Uji (JP)

( * ) Notice: Subject to any disclaimer, the term of this patent is extended or adjusted under 35 U.S.C. 154(b) by 0 days.

(21) Appl. No.: 09/580,429

(22) Filed: May 30, 2000

(30) Foreign Application Priority Data

May 31, 1999 (JP) ............................................. 11-151270

(51) Int. Cl.[7] .......................... G01R 31/02; G01R 31/28
(52) U.S. Cl. ..................................... 324/158.1; 324/761
(58) Field of Search .............................. 324/158.1, 754, 324/761, 537, 149

(56) References Cited

U.S. PATENT DOCUMENTS

| | | |
|---|---|---|
| 4,417,204 A | 11/1983 | Dehmel et al. |
| 4,820,975 A | 4/1989 | Diggle |
| 5,177,528 A * | 1/1993 | Koromegawa et al. ........ 355/53 |
| 5,525,912 A * | 6/1996 | Momohara .................. 324/754 |

FOREIGN PATENT DOCUMENTS

| | | | |
|---|---|---|---|
| EP | 1 059 538 A2 * | 12/2000 | ........... G01R/31/28 |
| JP | 63-29261 U | 8/1988 | |
| JP | 3-229167 | 10/1991 | |
| JP | 5-40893 | 6/1993 | |

* cited by examiner

*Primary Examiner*—Michael J. Sherry
*Assistant Examiner*—Paresh Patel
(74) *Attorney, Agent, or Firm*—Smith Patent Office

(57) ABSTRACT

A printed circuit board testing apparatus is provided with a test head driving mechanism having a holder member operable to selectively hold either of a dedicated test head and a versatile-use test head for moving the held test head relative to the printed circuit board. The test head driving mechanism includes an X-driver section for driving the held test head in an X-direction, a Y-driver section for driving the held test head in a Y-direction, a Z-driver section for driving the held test head in a Z-direction perpendicularly intersecting the printed circuit board, and a θ-driver section for turning the held test head about the Z-direction.

10 Claims, 6 Drawing Sheets

PRINTED CIRCUIT BOARD TESTING APPARATUS WITH DEDICATED TEST HEAD AND VERSATILE-USE TEST HEAD

This application is based on patent application No. 11-151270 filed in Japan, the contents of which is hereby incorporated by reference.

BACKGROUND OF THE INVENTION

This invention relates to a printed circuit board testing apparatus for testing conductivity or open circuit and current leakage of a circuit pattern formed on a printed circuit board.

There have been proposed printed circuit board testing apparatus. They can be generally classified into two types in the aspect of test head:

(a) A first type of printed circuit board testing apparatus is provided with a dedicated test head to test an individual circuit pattern on a printed circuit board. The testing is executed by rendering contacts mounted on the test head to come into contact with certain points of circuit patterns on the printed circuit board. The contacts are activated in a specified order to test the conductivity of each circuit pattern.

(b) A second type of circuit board testing apparatus is provided with a test head having a pair of probes or movable contacts which move from one to another position depending on the circuit pattern on the printed circuit board to be tested. Such test head is hereinafter referred to as "versatile-use test head", and is useable for testing a variety of circuit patterns. The second type of circuit board testing apparatus is disclosed in, for example, Japanese Unexamined Patent Publication No. (HEI) 3-229167 and Japanese Utility Model Unexamined Publication No. (HEI) 5-40893.

In the first type of circuit board testing apparatus, the dedicated test head is used only for particular printed circuit boards formed with the same circuit pattern. Accordingly, the time required for inspection or test of each printed circuit board is shortened if a large number of circuit boards having the same circuit pattern are to be tested. However, such dedicated test head designed specially for a particular printed circuit board needs a complicated production process, and approximately one week is required to produce one dedicated test head. Accordingly, this type of apparatus is suitable for testing a large number of printed circuit boards having the same circuit pattern at a time, but is not suitable for the case where a variety of printed circuit boards having different circuit patterns are tested one after another. In this type of apparatus, it is also required to keep a variety of dedicated test heads as a stock, and manage the status of stock to meet an expected repeated use for test of the particular printed circuit board.

Furthermore, recent years have seen an advanced technology of forming a very fine circuit pattern on a printed circuit board. Therefore, it becomes technically difficult to produce a dedicated test head capable of testing circuit boards having such very fine circuit patterns because adjacent contacts are required to be located at a very small space.

The second type of circuit board testing apparatus is adapted for general or versatile use. In this type of apparatus, a pair of probes or movable contacts are moved over the printed circuit board in accordance with pre-stored program data for testing. The program data for controlling the movement of contacts can be programmed more easily than programming Computer Aided Design (CAD) data for making a circuit pattern. This type of apparatus does not require production of a dedicated test head having a complicated configuration for individual circuit patterns of a printed circuit board. Despite the fact that the second type of apparatus needs a longer time for testing of each printed circuit board than the first type of apparatus, the second type of apparatus is advantageous in testing a small number of printed circuit boards for trial when, for example, prototype printed circuit boards are manufactured.

The two types of apparatus have their respective advantageous features and disadvantageous features, which have not sufficiently responded to a variety of requirements or demands in the inspection and testing operation. Also, it has been undesirable in the aspect of cost-effectiveness and installation space to equip the two types of apparatus.

SUMMARY OF THE INVENTION

It is an object of the present invention to provide a printed circuit board testing apparatus which is free from the problems residing in the prior art.

According to an aspect of the invention, a printed circuit board testing apparatus comprises a table for supporting a printed circuit board formed with a circuit pattern thereon, and a test head holding portion for holding a dedicated test head and a versatile-use test head in such a position as to face the circuit board supported on the table. The dedicated test head includes a plurality of fixed contacts. The versatile-use test head includes a pair of movable contacts movable independently from each other.

These and other objects, features and advantages of the present invention will become more apparent upon a reading of the following detailed description and accompanying drawings.

DETAILED DESCRIPTION OF PREFERRED EMBODIMENTS OF THE INVENTION

Figure 1:
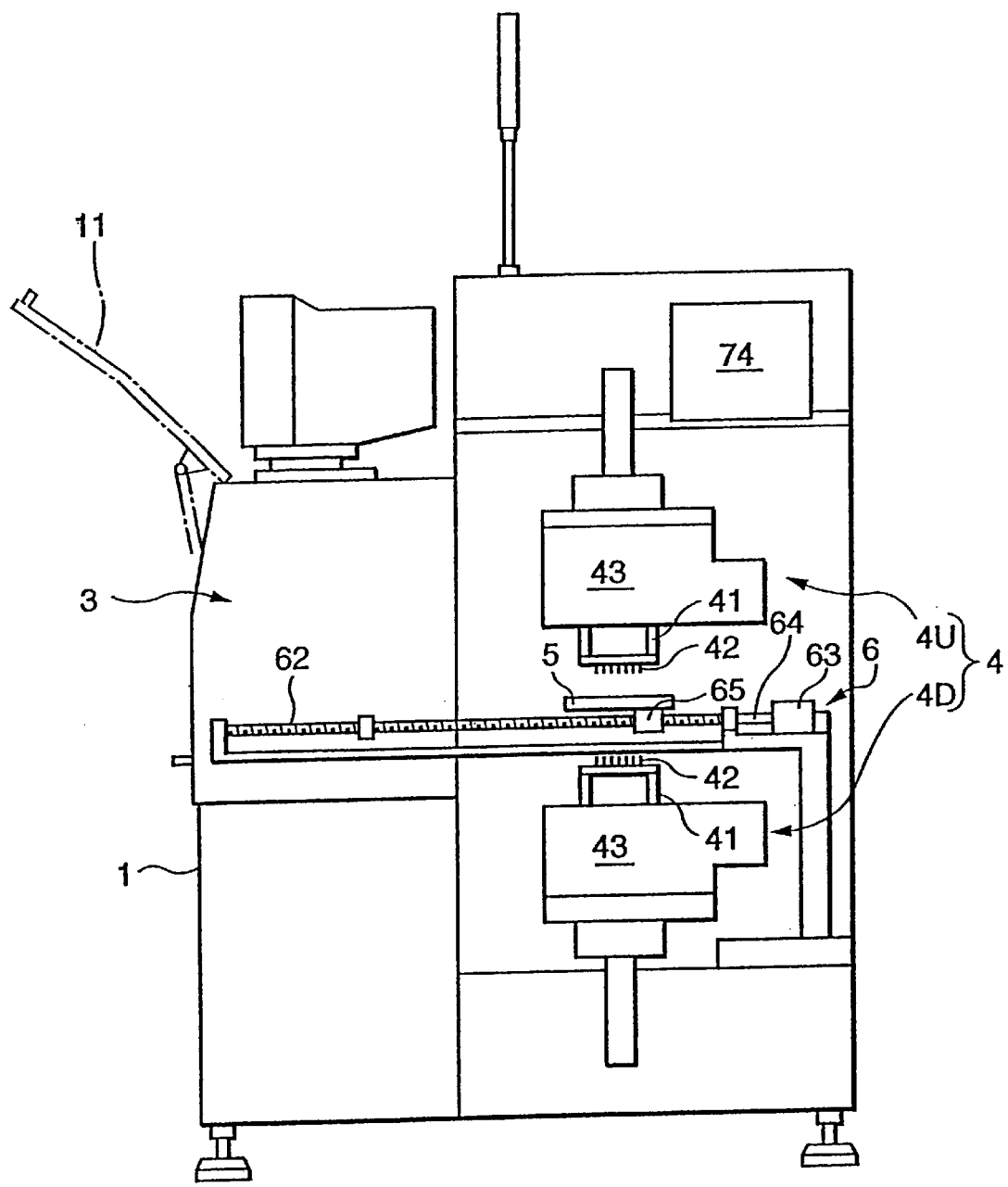
FIG. 1 is a schematic side view of a circuit board testing apparatus according to an embodiment of the invention.
Figure 2:
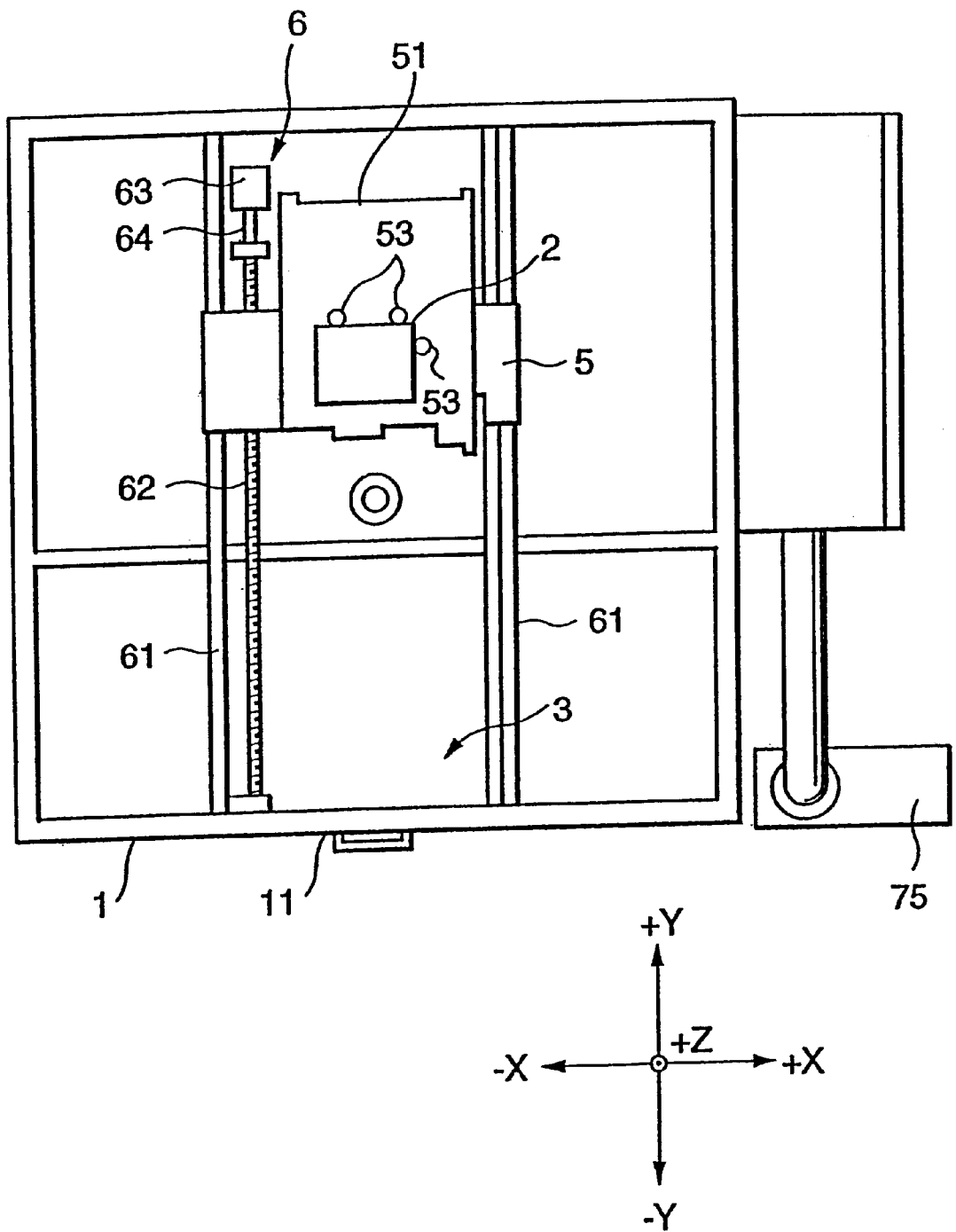
FIG. 2 is a schematic top plan view of the circuit board testing apparatus shown in FIG. 1.

FIG. 1 is a schematic side view of a circuit board testing apparatus according to an embodiment of the present invention, and FIG. 2 is a schematic top plan view of the circuit board testing apparatus. In order to clarify directions of movement and relative positions of the parts of the apparatus in drawings, X, Y and Z axes of rectangular coordinates are shown.

The circuit board testing apparatus includes a door 11 provided on the front (−Y side) of a main body 1 of the apparatus. The door 11 is opened to place a printed circuit board 2 to be tested in an initial position 3 provided in a middle of a forward chamber of the apparatus. The printed circuit board to be tested may be a bare printed circuit board on which an electric circuit pattern is printed but circuit elements such as IC chip, capacitors, resistors have not been mounted. Further, on the rear (+Y side) of the initial position 3 is provided a test section 4 where the circuit board 2 is tested or inspected. The signals representative of conductivity between points on the circuit pattern of the circuit board 2 is picked up or detected to evaluate the circuit board 2 to accept or deny. The tested circuit board 2 is returned to the initial position 3 where the tested board is in turn taken out through the front opening by the operator. In this embodiment, circuit boards 2 are manually placed in and taken out by the operator. However, automatic placement and withdrawal of circuit boards may be available with a circuit board transfer mechanism having a supply unit and a taking-out unit arranged on both sides of the initial position or along the X-direction. The supply unit receives a circuit board to be tested from an external device, and then places a circuit board in the initial position 3. The taking-out unit takes out the tested circuit board from the initial position 3, and transfers it to the external device.

A transfer table 5 is provided to transfer a circuit board 2. The transfer table 5 is reciprocatively moved in Y-directions between the.initial position 3 and the test section 4 by a transfer table drive mechanism 6. The transfer table drive mechanism 6 includes two guide rails 61 and 61 extending in the Y direction and spaced from each other in the X-direction. The transfer table 5 is slidable on those guide rails 61 and 61. In parallel with the guide rails 61 and 61, a ball screw 62 is disposed. One end (−Y side) of the ball screw 62 is rotatably supported on the main body 1 of the apparatus by way of a bearing. The other end (+Y side) is connected to a drive shaft 64 of a motor 63, whereby the ball screw 62 is rotated by the motor 63. Also, the ball screw 62 threads through a bracket 65 fixedly attached on the transfer table 5. The ball screw 62 and the bracket 65 are mechanically associated with each other such that when the motor 63 is permitted to drive in response to a command from a controller to be described later. The transfer table 5 is moved in the Y-direction, that is, to the initial position 3 or to the test section 4. The movement of the transfer table 5 corresponds to the rotation of the motor 63. Details of the transfer table 5 will be described later.

Figure 4:
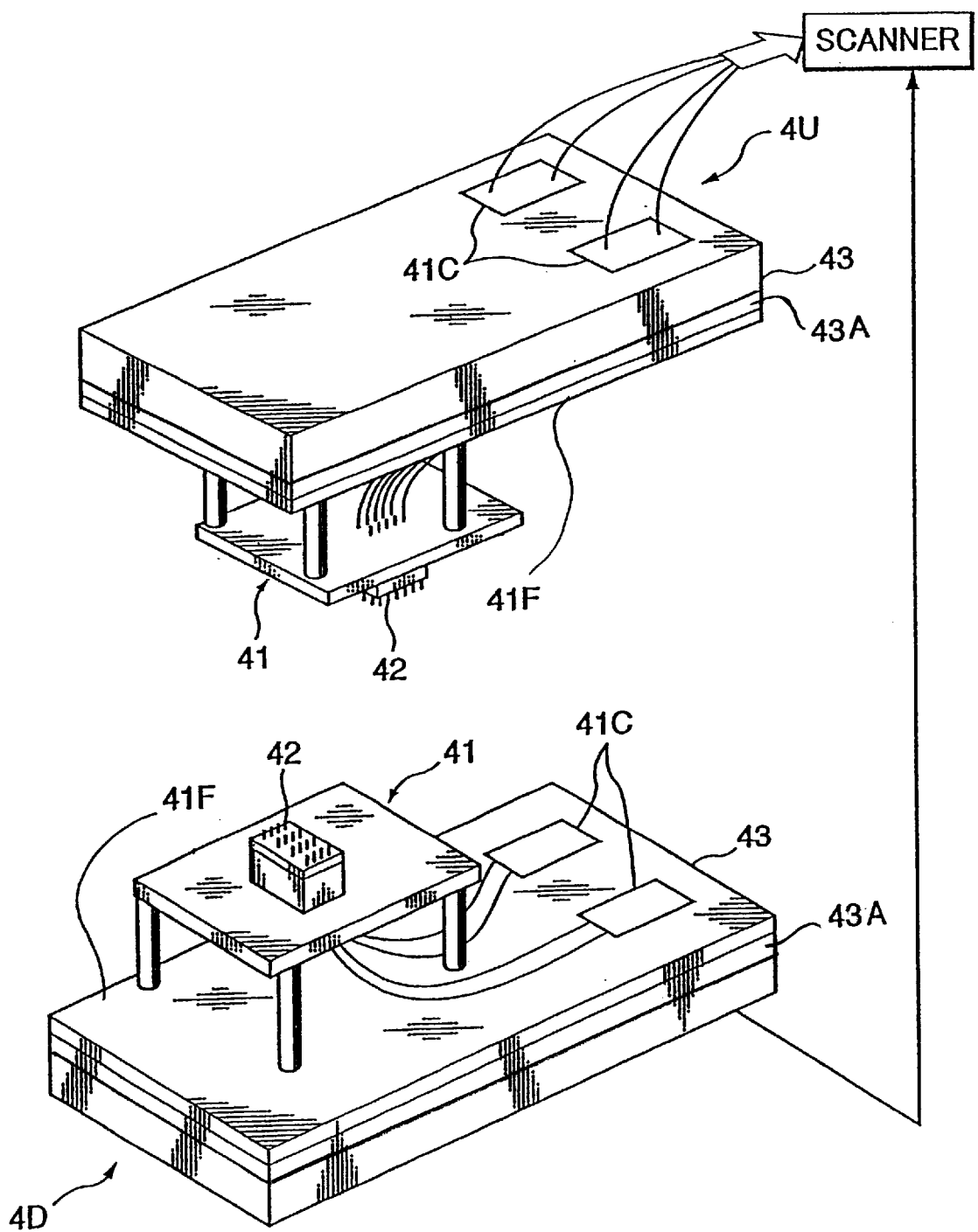
FIG. 4 is a perspective view of an upper tester unit and a lower tester unit of the circuit board testing apparatus shown in FIG. 1.

The test section 4 includes an upper tester unit 4U disposed on an upper side (+Z side) of the transfer table drive mechanism 6 for testing a circuit pattern formed on a top of a circuit board 2 and a lower tester unit 4D disposed on a lower side (−Z side) of the transfer table drive mechanism 6 for testing a circuit pattern formed on an underside of the circuit board 2. Both tester units 4U and 4D have the same configuration and are symmetrically disposed with respect to the travel path of the transfer table 5. A dedicated test head 41 (see FIG. 4) and a versatile-use test head 141 (see FIG. 5) are selectively mounted on the upper and lower tester units 4U and 4D as described below.

The dedicated test head 41 is adapted for testing a circuit board having a circuit pattern where lands are arrayed in a relatively regular order of matrix to make contact with contacts of the test head 41. In this sense, the dedicated test head 41 has a plurality of contacts 42 arrayed in a matrix at a certain pitch. In the case where the dedicated test head 41 is used, generally all the contacts 42 are caused to come into contact with the lands on the circuit board 2. Accordingly, a pair of contacts 42 opposing each other with respect to an electrical path to be tested are successively selected one pair after another among all the contacts 42 in accordance with a pre-stored program to thereby test conductivity, open circuit and current leakage of the circuit board 2.

The versatile-use test head 141 is adapted for testing a circuit board where lands to make contact with contacts of the test head 141 are arrayed generally non-regularly. The versatile-use test head 141 is provided with at least one pair of contacts 142 which are movable independently from each other in X-, Y-, and Z-directions. In the case where the versatile-use test head 141 is used, the pair of contacts 142 are caused to come into contact with an arbitrary one pair of lands opposing each other with respect to an electrical path to be tested, and then come into contact with another pair of lands as the contacts 142 are moved independently in a specified direction. In this way, the testing of the circuit board is implemented by successively allowing the pair of contacts 142 to come into contact with pairs of lands one pair after another while moving the contacts 142 in accordance with a pre-stored program.

There are several arrangements of mounting the dedicated test head 41 and the versatile-use test head 141 with respect to the upper and lower tester units 4U and 4D. As an arrangement, the dedicated test head 41 is mounted both on the upper tester unit 4U and the lower tester unit 4D. Alternatively, the versatile-use test head 141 is mounted both on the upper and lower tester units 4U and 4D. Further alternatively, the dedicated test head 41 is mounted on the upper test unit 4U while the versatile-use test head 141 is mounted on the lower tester unit 4D, or vice versa.

Figure 3:
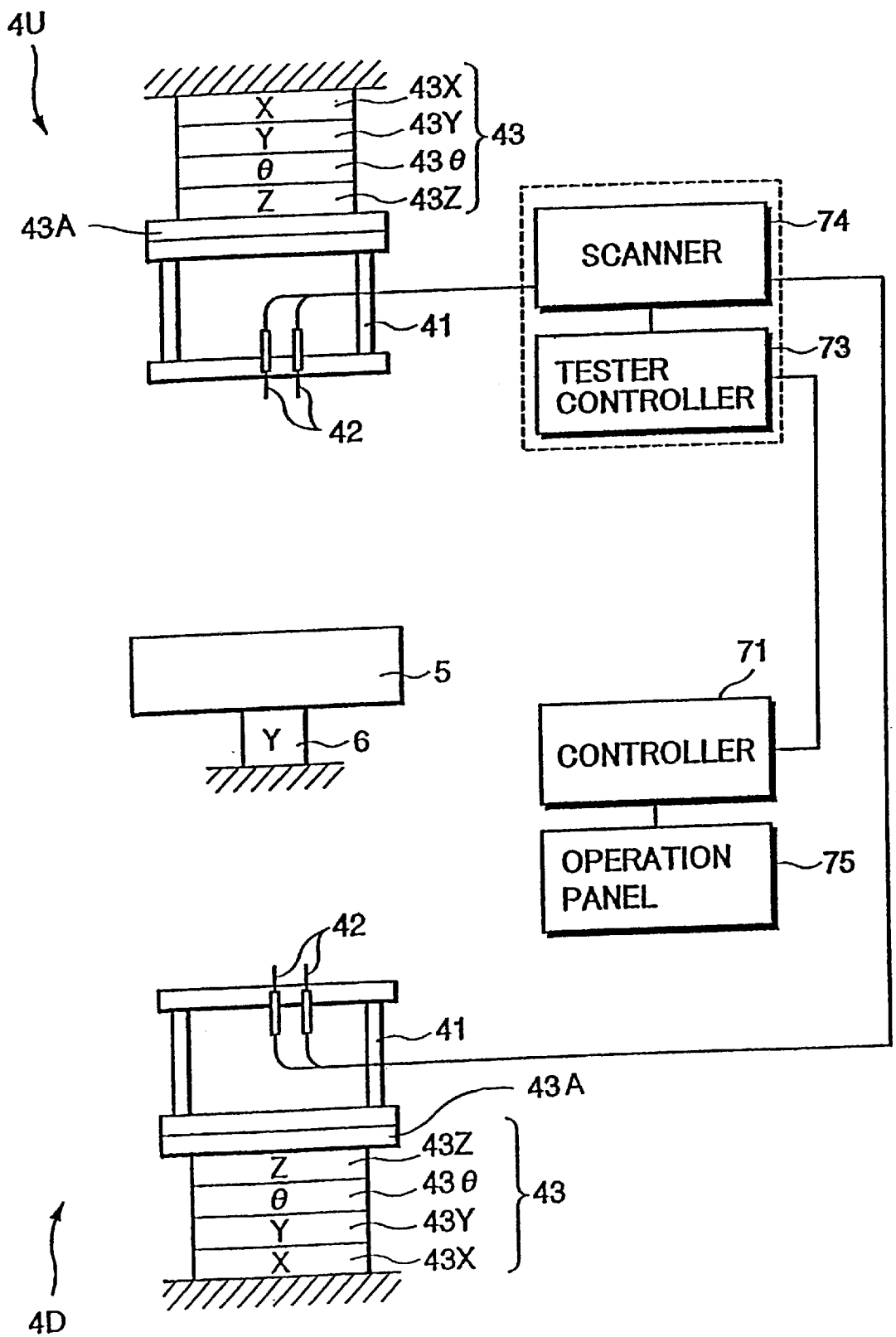
FIG. 3 is a diagram showing a test head driving mechanism of the circuit board testing apparatus.

FIG. 3 is a schematic diagram of the circuit board testing apparatus with the dedicated test head 41 mounted both on the upper and lower tester units 4U and 4D. As shown in FIG. 3, a test head drive mechanism 43 is provided with an X-driver section 43X for moving the dedicated test head 41 in the X direction with respect to the main body 1, a Y-driver section 43Y connected with the X-driver section 43X for moving the dedicated test head 41 in the Y direction, a θ driver section 43 connected with the Y-driver section 43Y for turning the dedicated test head 41 about the Z-axis, and a Zdriver section 43Z connected to the θ-driver section 43 θ for moving the dedicated test head 41 in the Z direction.

A controller 71 controls the test head drive mechanism 43 to position the dedicated test head 41 relative to the transfer table 5 and move the dedicated test head 41 up and down in the Z direction to thereby make the contacts or probes 42 of the dedicated test head 41 contact with certain points of the circuit pattern on the circuit board 2 or move the contacts 42 toward and away from the circuit pattern on the circuit board 2.

Next, a configuration of the transfer table 5 is described in detail with reference to FIG. 2. The transfer table 5 includes a circuit board holder section 51 for retaining a circuit board 2. The circuit board holder section 51 is provided with three retainer pins 53. A circuit board 2 is pushed against the three retainer pins 53 by a biasing member (not shown), thereby being firmly retained on the holder section 51 of the transfer table 5. Further, the circuit board holder section 51 of the transfer table 5 is formed with an opening (not shown) in a specified area thereof. The opening is adapted for allowing contacts or probes 42 of the dedicated test head 41 mounted on the lower tester unit 4D (see FIGS. 1, 3, and 4) to come into contact with a circuit pattern formed on the underside of the circuit board 2, and allowing the contacts or probes 142 of the versatile-use test head 141 to come into contact with a circuit pattern formed on the underside of the circuit board 2 when the versatile-use test head 141 is mounted on the lower tester unit 4D.

Next, returning to FIG. 3, description is made about an electric circuit arrangement of the circuit board testing apparatus. The apparatus is provided with a CPU, a ROM, a RAM, a motor driver, and the controller 71. The controller 71 controls the entire operation of the apparatus in accordance with a program pre-stored in the ROM. The controller 71 controls the transfer table drive mechanism 6 and the test head drive mechanism 43 based on detection signals to render the contacts 42 of the dedicated test heads 41 mounted on the upper and lower tester units 4U and 4D to come into contact with the specified points of the circuit pattern formed on a circuit board 2 on the transfer table 5.

Further, the controller 71 is electrically connected with a tester controller 73. Upon completion of the contact of the contacts 42 with the circuit pattern as mentioned above, a test start command is given to the tester controller 73 from the controller 71. The test controller 73 permits a scanner 74 to electrically activate pairs of contacts sequentially by way of multi-pole connectors 41C to thereby test each electric circuit of a circuit pattern. With the testing completed, test results are given to the controller 71 through the tester controller 73. An operation panel 75 is electrically connected to the controller 71 to enable the operator to input instruction or set parameters to the controller 71.

Figure 5:
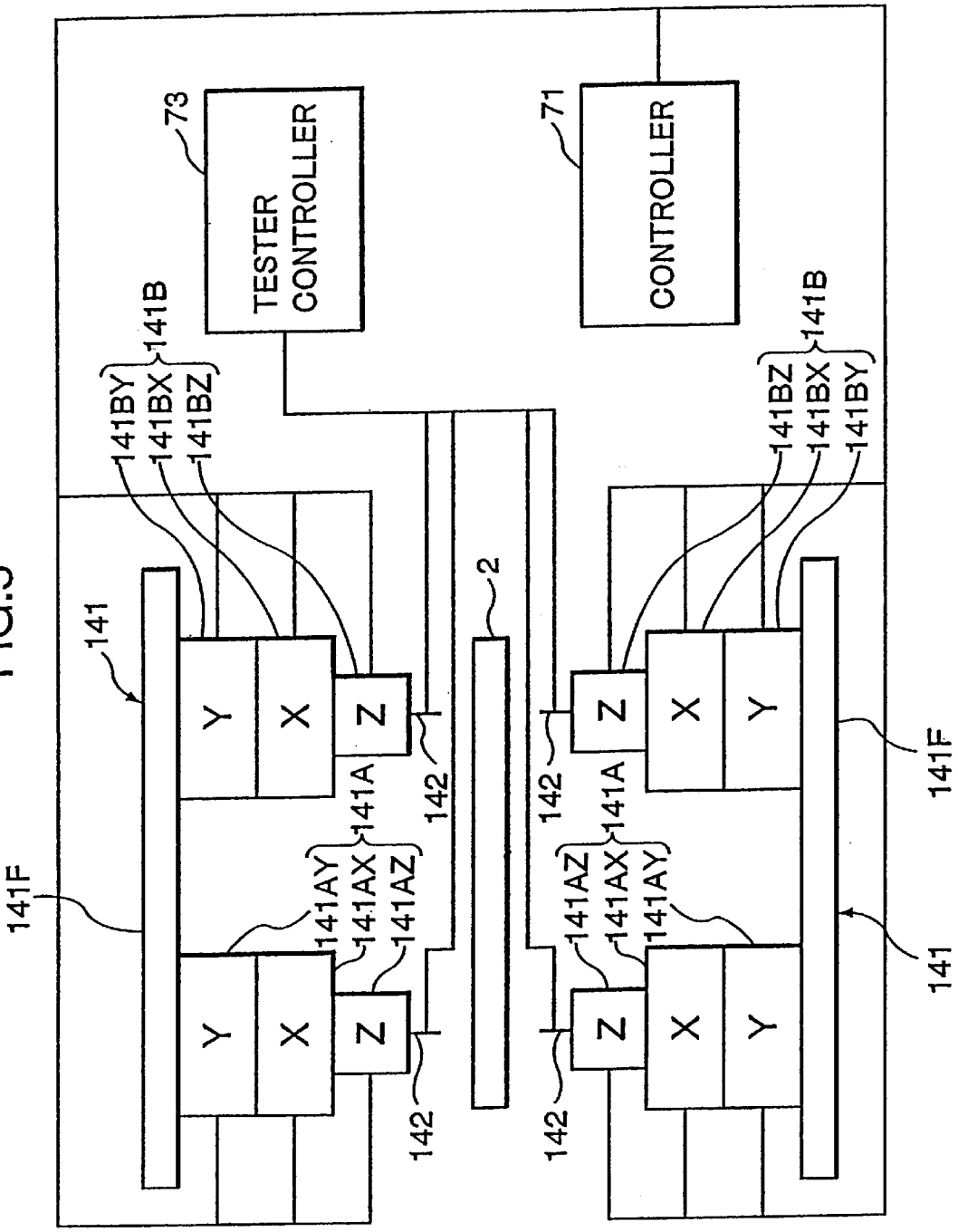
FIG. 5 is a schematic diagram of the circuit board testing apparatus mounted with a versatile-use test head.
Figure 6:
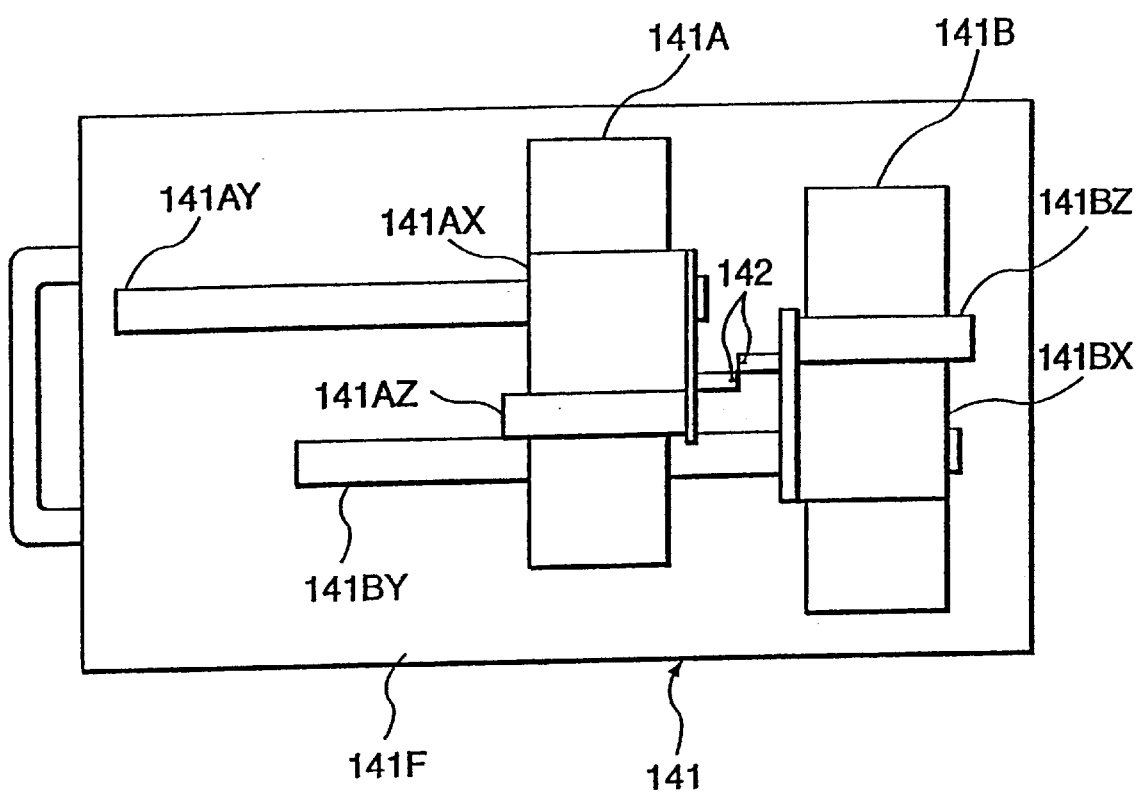
FIG. 6 is a top plan view of the versatile-use test head.

FIG. 5 is a schematic diagram of a construction of the circuit board testing apparatus with versatile-use test heads 141 being mounted both on the upper tester unit 4U and the lower tester unit 4D. As described above, the versatile-use test head 141 is provided with a pair of movable contacts 142. The versatile-use test head 141 is provided with contact drive mechanisms 141A, 141B for respectively moving the pair of contacts 142, 142 in X-, Y-, and Z-directions independently. The contact drive mechanisms 141A, 141B have the same configuration to each other and are adapted to respectively move a pair of contacts 142, 142 independently in X-, Y-, and Z-directions in accordance with program data that has been programmed and stored in advance based on Computer Aided Design (CAD) data (governor data) about a circuit pattern of a circuit board.

One of the pair of contacts 142, 142 is controlled by the contact drive mechanism 141A, and the other one of the contacts 142, 142 is controlled by the contact drive mechanism 141B. The contact drive mechanism 141A (141B) is provided with a Z-driver section 141AZ (141BZ) for moving the contact 142 (142) in the Z direction with respect to the main body 1 while holding the contact 142 (142), an X-driver section 141AX (141BX) connected to the Z-driver section 141AZ (141BZ) to move the contact 142 (142) in the X direction, and a Y-driver section 141AY (141BY) connected to the X-driver section 141AX (141BX) to move the contact 142 (142) in the Y direction. Each of the driver sections 141AX, 141AY, and 141AZ (141BX, 141BY, and 141BZ) has a drive source such as AC motor and stepping motor, and a slider mechanism.

Driving the X-driver section 141AX (141BX) enables to move the contact 142 (142) in the X direction; driving the Y-driver section 141AY (141BY) enables to move the contact 142 (142) in the Y direction; and driving the Z-driver section 141AZ (141BZ) enables to move the contact 142 (142) in the Z direction. With this arrangement, the pair of contacts 142, 142 in the upper tester unit 4U (the lower tester unit 4D) are moved toward and away from the circuit pattern formed on the circuit board 2 or allowed to come into contact with the certain points of the circuit pattern on the circuit board 2.

The configuration of a mounting portion of the versatile-use test head 141 is substantially the same as that of the dedicated test head 41. Specifically, a mount member 141F of the versatile-use test head 141 and a mount member 41F of the dedicated test head 41 are generally the same in size (width, length, height) and shape. The test head drive mechanism 43 is provided with a holding member 43a operable to receive and hold the mount member 141F of the versatile-use test head 141 or the mount member 41F of the dedicated test head 41. The dedicated test head 41 and the versatile-use test head 141 are selectively mounted on the test head drive mechanism 43 depending on the circuit pattern of a circuit board to be tested. After the mounting, a cable for measuring an electric current or voltage of a circuit board is connected to the tester controller 73, and a cable for driving the drive mechanisms 6 and 43 is connected to the controller 71. Further, a test program which is stored individually for the circuit pattern of a circuit board to be tested is given to the controller 71 to update the program for testing.

In this way, the versatile-use test head 141 (or the dedicated test head 41) is mounted on the test head drive mechanism 43 depending on the circuit pattern of a circuit board to be tested, and the cables are connected to the corresponding parts of the apparatus, thereby completing setup of the test head prior to testing of a circuit board.

In the case where the versatile-use.test head 141 is mounted, after a circuit board to be tested is placed on the transfer table 5, the pair of contacts 142 of the versatile-use test head 141 are moved independently in specified directions sequentially over the circuit pattern of the circuit board 2 in accordance with the loaded test program to thereby test conductivity, open circuit and current leakage of the circuit board 2.

In the case where the dedicated test head 41 is mounted, as described above, a pair of contacts 42 opposing each other with respect to an electrical path to be tested are selected one pair after another among all the contacts 42 in accordance with a pre-stored program to thereby test conductivity, open circuit and current leakage of the circuit board 2.

In the foregoing embodiment, the dedicated test head 41 and the versatile-use test head 141 are interchangeably mounted on the test head drive mechanism 43. Alternatively, the versatile-use test head 141 may be mounted on a certain part other of the circuit board testing apparatus than the test head drive mechanism 43 because the contacts 142 of the versatile-use test head 141 are freely movable in the X-, Y-, and Z-directions by the contact drive mechanism 141A (141B).

In the foregoing embodiment, the test head drive mechanism 43 is provided with the X-driver section 43X, Ydriver section 43Y, θ-driver section 43 θ, which are adapted to position the dedicated test head 41 relative to the circuit board 2 placed on the transfer table 5, and with the Z-driver section 43Z for moving the dedicated test head 41 (or the versatile-use test head 141) up and down to make contact with certain points of the circuit pattern on the circuit board 2. Alternatively, an additional position adjusting mechanism may be provided to enable the transfer table 5 to move in the Z direction. This altered arrangement enables to eliminate the test head drive mechanism 43.

In the foregoing embodiment, the versatile-use test heads 141 are mounted both on the upper and lower tester units 4U and 4D, and the dedicated test heads 41 are similarly mounted both on the upper and lower tester units 4U and 4D. There may be a case, however, that part of the top (or underside) of the circuit board has a less circuit pattern according to the kind of circuit board, which makes it possible to complete testing within a shorter period of time without need of a dedicated test head. In this case, mounting the versatile-use test head 141 on the upper tester unit 4U (or the lower tester unit 4D) enables to test the circuit board in a shorter period of time. This altered arrangement enables to eliminate provision of a dedicated test head and a storage space for such a dedicated test head, which is more advantageous in the aspect of cost and storage space reduction.

As described above, an inventive printed circuit board testing apparatus comprises a table for supporting a printed circuit board formed with a circuit pattern thereon, and a test head holding portion for holding a dedicated test head and a versatile-use test head in such a position as to face the circuit board supported on the table. The dedicated test head includes a plurality of fixed contacts. The versatile-use test head includes a pair of movable contacts movable independently from each other.

The test head holding portion may include a test head driving mechanism provided with a holder member operable to selectively hold either of the dedicated test head and the versatile-use test head for moving the held test head relative to the printed circuit board.

The test head driving mechanism may be provided with an X-driver section for driving the held test head in an X-direction, a Y-driver section for driving the held test head in a Y-direction, a Z-driver section for driving the held test head in a Z-direction perpendicularly intersecting the printed circuit board, and a θ-driver section for turning the held test head about the Z-direction.

The versatile-use test head may be provided with a pair of driver units for driving the pair of movable contacts, respectively. Each driver unit is provided with an X-driver section for driving the contact in an X-direction, a Y-driver section for driving the contact in a Y-direction, and a Z-driver section for driving the contact in a Z-direction perpendicularly intersecting the printed circuit board.

The test head holding portion may include an upper test head holder unit for holding one of the dedicated test head and versatile-use test head in such a position as to face an upper surface of the printed circuit board, and a lower test head holder unit for holding one of the dedicated test head and versatile-use test head in such a position as to face a lower surface of the printed circuit board. Each of the upper and lower test heads may be provided with a test head driving mechanism provided with a holder member operable to selectively hold either of the dedicated test head and the versatile-use test head for moving the held test head relative to the printed circuit board.

The inventive circuit board testing apparatus is provided with such an arrangement as to enable selective mount of a dedicated test head and a versatile-use test head. Accordingly, when a circuit board having a very fine circuit pattern is tested, which is difficult for the dedicated test head to measure, the versatile-use test head is mounted, and the program data is loaded that enables to move the movable contacts of the test head in such a manner as to accomplish testing of the circuit board having such a very fine circuit pattern. This will eliminate the necessity of specially producing a dedicated test head for the circuit board having the very fine circuit pattern, reducing the testing costs remarkably.

Also, in the case of a small number of circuit boards, production of a dedicated test head for the circuit board is not desirable in the aspect of production cost. Further, in the case of prototype circuit boards for trial or a circuit board is formed with a simpler circuit pattern, a dedicated test head is not necessary. In these cases, accordingly, it is desirable in the aspect of testing costs and testing time to mount the versatile-use test head on the apparatus and load program data for moving the movable contacts of the test head. On the other hand, in the case where a number of circuit boards having the same circuit pattern to be tested exceeds, e.g., 100 (namely, a number of mass-produced circuit boards are tested at a time sequentially), a dedicated test head specifically designed for a particular circuit pattern is mounted. The mount of the dedicated test head enables to reduce the time required for testing. In this way, the inventive circuit board testing apparatus allows selective mounting of the dedicated test head and the versatile-use test head on a single apparatus according to the requirement of testing, thus making it possible to test a variety kinds of printed circuit board at a reduced cost.

As this invention may be embodied in several forms without departing from the spirit of essential characteristics thereof, the foregoing embodiment is therefore illustrative and not restrictive, since the scope of the invention is defined by the appended claims rather than by the description preceding them, and all changes that fall within metes and bounds of the claims, or equivalence of such metes and bounds are therefore intended to embraced by the claims.

What is claimed is:

1. A printed circuit board testing apparatus for testing a printed circuit board having a circuit pattern with lands, comprising:

a table for supporting the printed circuit board;

a dedicated test head including a plurality of contacts to come into contact with at least one of the lands on the circuit board on the table;

a versatile-use test head including:
      a pair of moveable contacts moveable independently from each other, and
      a pair of driver units for respectively driving the moveable contacts to bring them into contact with a pair of lands selectively in accordance with a predetermined program; and a test head holding portion for selectively holding the dedicated test head and the versatile-use test head for their alternative use.

2. A printed circuit board testing apparatus according to claim 1, wherein the test head holding portion includes a test head driving mechanism provided with a holder member operable to selectively hold either of the dedicated test head and the versatile-use test head for moving the held test head relative to the printed circuit board.

3. A printed circuit board testing apparatus according to claim 2, wherein the test head driving mechanism includes:

an X-driver section for driving the held test head in an X-direction;

a Y-driver section for driving the held test head in a Y-direction;

a Z-driver section for driving the held test head in a Z-direction perpendicularly intersecting the printed circuit board; and a θ-driver section for turning the held test head about the Z-direction.

4. A printed circuit board testing apparatus according to claim 3, wherein each of said driver units being provided with:

an X-driver section for driving the contact in an X-direction;

a Y-driver section for driving the contact in a Y-direction; and a Z-driver section for driving the contact in a Z-direction perpendicularly intersecting the printed circuit board.

5. A printed circuit board testing apparatus according to claim 1, wherein each of said driver units being provided with:

an X-driver section for driving the contact in an X-direction;

a Y-driver section for driving the contact in a Y-direction; and a Z-driver section for driving the contact in a Z-direction perpendicularly intersecting the printed circuit board.

6. A printed circuit board testing apparatus according to claim 1, wherein the test head holding portion includes:

an upper test head holder unit for holding one of the dedicated test head and versatile-use test head in such a position as to face an upper surface of the printed circuit board; and a lower test head holder unit for holding one of the dedicated test head and versatile-use test head in such a position as to face a lower surface of the printed circuit board.

7. A printed circuit board testing apparatus according to claim 6, wherein each of the upper and lower test heads includes a test head driving mechanism provided with a holder member operable to selectively hold either of the dedicated test head and the versatile-use test head for moving the held test head relative to the printed circuit board.

8. A printed circuit board testing apparatus according to claim 7, wherein the test head driving mechanism includes:

an X-driver section for driving the held test head in an X-direction;

a Y-driver section for driving the held test head in a Y-direction;

a Z-driver section for driving the held test head in a Z-direction perpendicularly intersecting the printed circuit board; and a θ-driver section for turning the held test head about the Z-direction.

9. A printed circuit board testing apparatus according to claim 8, wherein the versatile-use test head includes a pair of driver units for driving the pair of movable contacts, respectively, each driver unit being provided with:

an X-driver section for driving the contact in an X-direction;

a Y-driver section for driving the contact in a Y-direction; and a Z-driver section for driving the contact in a Z-direction perpendicularly intersecting the printed circuit board.

10. A printed circuit board testing apparatus according to claim 1, wherein the dedicated test head includes a first mount member to be coupled with the test head holding portion for holding the dedicated test head by the holding portion, and the dedicated test head includes a second mount member having the same configuration as that of the first mount member, so as to be coupled with the test head holding portion for holding the versatile-use test head by the holding portion.

* * * * *